(12) United States Patent  
Fung et al.

(10) Patent No.: US 7,336,212 B2
(45) Date of Patent: Feb. 26, 2008

(54) APPARATUS AND METHODS FOR MEASUREMENT OF ANALOG VOLTAGES IN AN INTEGRATED CIRCUIT

(75) Inventors: Richard W. Fung, Markham (CA); Ramesh Senthinathan, Richmond Hill (CA); Ronny Chan, North York (CA)

(73) Assignee: ATI Technologies Inc., Markham, Ontario (CA)

( * ) Notice: Subject to any disclaimer, the term of this patent is extended or adjusted under 35 U.S.C. 154(b) by 135 days.

(21) Appl. No.: 10/908,197

(22) Filed: May 2, 2005

(65) Prior Publication Data

US 2006/0247873 A1 Nov. 2, 2006

(51) Int. Cl.
*H03M 1/12* (2006.01)
*G01R 13/02* (2006.01)

(52) U.S. Cl. .................. 341/164; 341/155; 324/607; 714/740

(58) Field of Classification Search ........... 341/120, 341/155, 164, 165; 324/72, 73.1, 158.1, 324/606, 607, 763; 714/733, 740
See application file for complete search history.

(56) References Cited

U.S. PATENT DOCUMENTS

| | | | | |
|---|---|---|---|---|
| 3,634,851 A | * | 1/1972 | Klein | 341/169 |
| 4,528,591 A | * | 7/1985 | Liepe et al. | 341/164 |
| 5,184,162 A | * | 2/1993 | Saitoh et al. | 324/158.1 |
| 5,436,558 A | * | 7/1995 | Saitoh et al. | 324/158.1 |
| 5,543,795 A | | 8/1996 | Fernald | |
| 5,577,052 A | * | 11/1996 | Morris | 714/733 |
| 5,774,733 A | | 6/1998 | Nolan et al. | |
| 6,011,500 A | * | 1/2000 | Noda et al. | 341/144 |
| 7,081,841 B1 | * | 7/2006 | Feist et al. | 341/120 |
| 2002/0167611 A1 | | 11/2002 | Boemler et al. | |
| 2003/0025511 A1 | * | 2/2003 | Gaither et al. | 324/606 |
| 2004/0183709 A1 | * | 9/2004 | Kobayashi et al. | 341/164 |
| 2004/0227651 A1 | | 11/2004 | Furuichi | |

OTHER PUBLICATIONS

Millman, J.; Microelectronics Digital and Analog Circuits and Systems; 1979; McGraw-Hill; pp. 610-611.*
Hajjar, Ara et al.; A Multi-Pass A/D Conversion Technique for Extracting on-Chip Analog Signals; IEEE; 1998; pp. 280-283.
International Search Report from European Patent Office dated Sep. 25, 2006, for International Application No. PCT/US2006/016863, pp. 1-14.

* cited by examiner

*Primary Examiner*—Howard L. Williams
(74) *Attorney, Agent, or Firm*—Vedder Price P.C.

(57) ABSTRACT

The present disclosure relates to apparatus and methods for measurement of analog voltages in an integrated circuit. In particular, the apparatus includes an on-chip digital-to-analog converter configured to receive a variable digital input code and output a corresponding analog voltage corresponding to the variable digital input code. The apparatus also includes an on-chip comparator circuit configured to receive the analog voltage output by the digital-to-analog converter and a test analog voltage as inputs and to provide an output indicating the test analog voltage. Further, the apparatus includes an on-chip logic operative to determine the test analog voltage based on the output of the comparator circuit. A corresponding method is also disclosed.

21 Claims, 6 Drawing Sheets

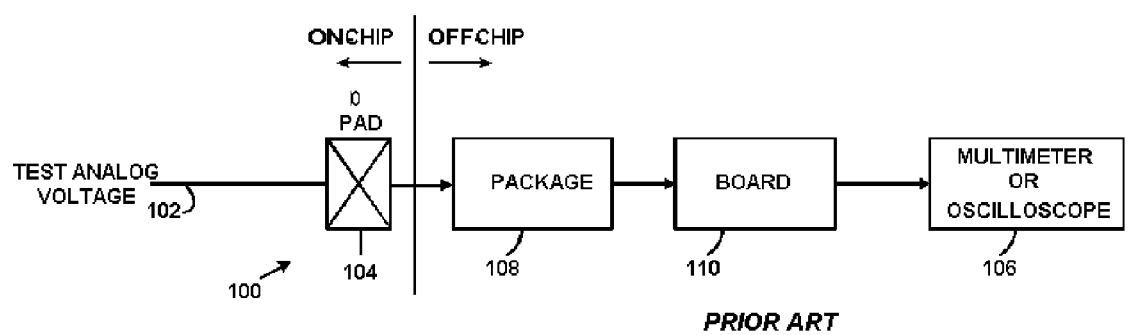
FIG. 1 *PRIOR ART*
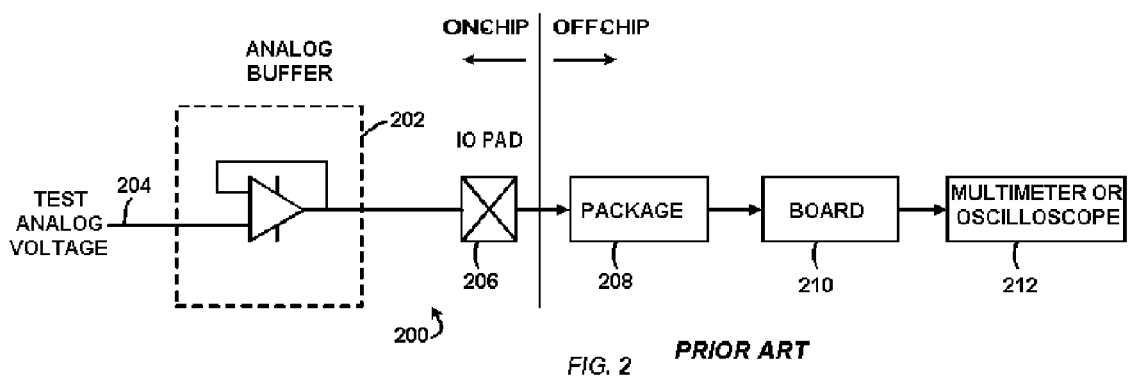
FIG. 2 *PRIOR ART*

APPARATUS AND METHODS FOR MEASUREMENT OF ANALOG VOLTAGES IN AN INTEGRATED CIRCUIT

DESCRIPTION

The present disclosure relates to apparatus and methods for measuring analog voltages within an integrated circuit, and more particularly, for on-chip measurement of the analog voltages.

BACKGROUND OF THE INVENTION

As integrated circuits, such as very large scale integration (VIS) circuits increase in complexity, operating speed, and power consumption, the ability to test such circuits becomes more difficult. Analog circuits, in particular, are formed using ultra-deep sub micron process technologies, and such circuits often exhibit behavior unobservable through circuit simulations. It is, therefore, desirable to be able to measure on-chip analog voltages during testing of such integrated circuits for purposes of verification of the circuit against design simulations.

In order to measure analog voltages present within an integrated circuit, chip or die (it is noted that these terms are used synonymously for an integrated circuit), it is known to bring an on-chip signal off of the chip for measurements. One such arrangement 100 is illustrated in FIG. 1. As shown the arrangement includes a test analog voltage 102, which is located on a chip or die delivered to an I/O pad 104 in order to take the voltage off of the chip for measurement. When the voltage being tested is taken off-chip through the I/O pad 104, the voltage may then be measured with an oscilloscope or multimeter 106. The circuit of FIG. 1 in this way allows open-circuit voltage measurements with the multimeter or oscilloscope 106, which normally is a high impedance device.

When being taken off-chip, however, the voltage must travel from the chip or die via a package 108 in which the chip or die is housed. The package includes bond wires or redistribution layers (RDL, as used in "flip-chip" technology), which introduce parasitic effects, such as parasitic capacitance. Moreover, the analog voltage also will typically be routed via printed circuit board (pcb) traces on a board 110 to which the package 108 is mounted, introducing even more parasitic effects. If, however, the test analog voltage 102 is weak, the integrity of the signal might not be able to withstand the parasitic effects of the I/O pad 104, package 108, and the board 110 leading to an inability to measure the voltage accurately with the multimeter or oscilloscope 106.

In order to overcome the disadvantages of the arrangement of FIG. 1, it is also known to increase drive strengths of weak on-chip analog signals through the use of a driver, such as a buffer. In particular, FIG. 2 illustrates an arrangement 200 having such a buffer 202 that receives the test analog voltage 204 and drives the signal to an I/O pad 206. As an example, the buffer 202 could be realized with an operational amplifier connected in unity gain configuration. From the pad 206, the signal is sent via a package 208 and a printed circuit board trace 210 on which the package 208 is mounted to a multimeter or oscilloscope 212 for measurement. With this arrangement, however, non-ideal effects that affect the accuracy of the test analog voltage 204 off-chip may include an inherent offset voltage of the analog buffer 202, as well as noise and losses that accumulate from the I/O pad 206, the package 208 and the board 210.

Another known arrangement for on-chip voltage measurement may include the use of analog-to-digital converter (ADC) that affords on-chip measurement of the analog voltages. In particular, FIG. 3 illustrates such an arrangement 300 where a test analog voltage 302 is delivered to an ADC 304, which converts the test analog voltage 302 to a digital value of N-bits 308 based on conversion with respect to reference voltage(s) 306. The digital value of N-bits 308 is then sent to a hardware registrar 310 for temporary storage to be read out via a connection 312 to a register interface 314 and then to a logic (not shown) located on the chip. The arrangement of FIG. 3, however, although providing increased testability because the test voltage is not brought off-chip, and mitigating the non-ideal effects picked up through the path of an I/O pad, package, and board, is nonetheless very costly in terms of silicon area. Additionally, such an arrangement 300 adds further complexity that makes this type of testing structure unfeasible for many highly integrated ASIC designs.

BRIEF DESCRIPTION OF THE DRAWINGS

FIG. 1 illustrates an example of a prior arrangement for measuring analog voltages in an integrated circuit.

FIG. 2 illustrates another example of an arrangement for measuring analog voltages in an integrated circuit.

DETAILED DESCRIPTION OF THE PRESENT EMBODIMENTS

The present disclosure relates to apparatus and methods for measurement of analog voltages in an integrated circuit. In particular, an apparatus for on-chip measurement of analog voltages is disclosed. The apparatus includes an on-chip digital-to-analog converter configured to receive a variable digital input code and output a corresponding analog voltage corresponding to the variable digital input code. The apparatus also includes an on-chip comparator circuit configured to receive the analog voltage output by the digital-to-analog converter and a test analog voltage as inputs and to provide an output indicating the test analog voltage. Further, the apparatus includes an on-chip logic operative to determine the test analog voltage based on the output of the comparator circuit.

The present disclosure also includes a method for on-chip measurement of analog voltages that includes providing a variable digital input code to an on-chip digital-to-analog converter located in an integrated circuit, the variable digital input code configured to one of increment or decrement through a plurality of digital codes. Additionally, the method includes outputting a plurality of analog voltages from the digital-to-analog converter corresponding to respective digital codes of the digital input. The output of the digital-to-analog converter is then compared to a test analog voltage provided on-chip. Finally, the test analog voltage is measured by determining when the voltage level of the output of the digital-to-analog converter at least one of exceeds or falls below the test analog voltage based on comparison of the output of the digital-to-analog converter to the test analog voltage. The resulting digital input code to the DAC would then represent the test analog voltage in digital form.

The presently disclosed apparatus and methods afford on-chip measurement of analog voltages within an integrated circuit, thereby eliminating the need to bring the analog voltage off the die. Accordingly the parasitic effects of the integrated circuit package, and circuit board, which are problematic in the known art, are avoided. Moreover, the disclosed apparatus and methods may utilize an existing digital-to-analog converter already present in the integrated circuit, such as a video DAC, thereby minimizing the space utilized on the integrated circuit for measurements of analog voltages as well as the expensive costs associated with devices in the prior art that provides on-chip analog voltage measurements (e.g., ADCs).

Figure 3:
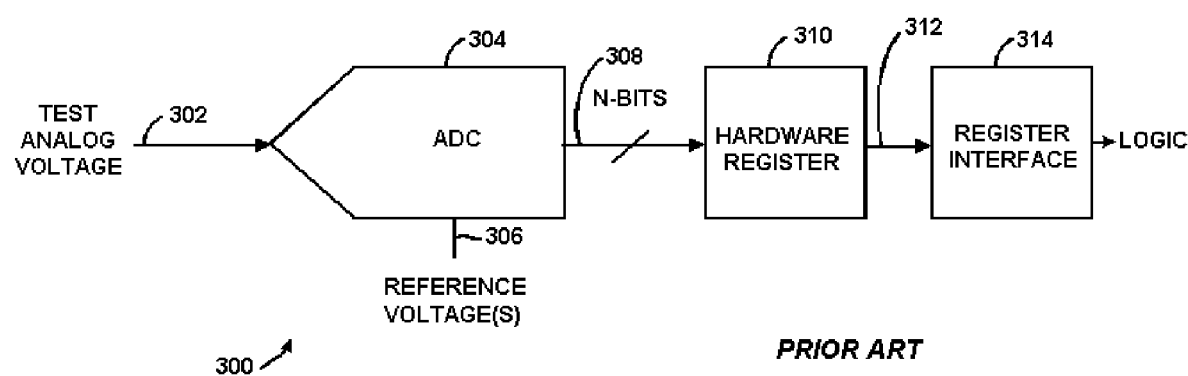
FIG. 3 illustrates yet another example of a conventional circuit for measuring analog voltages in an integrated circuit on-chip.
Figure 4:
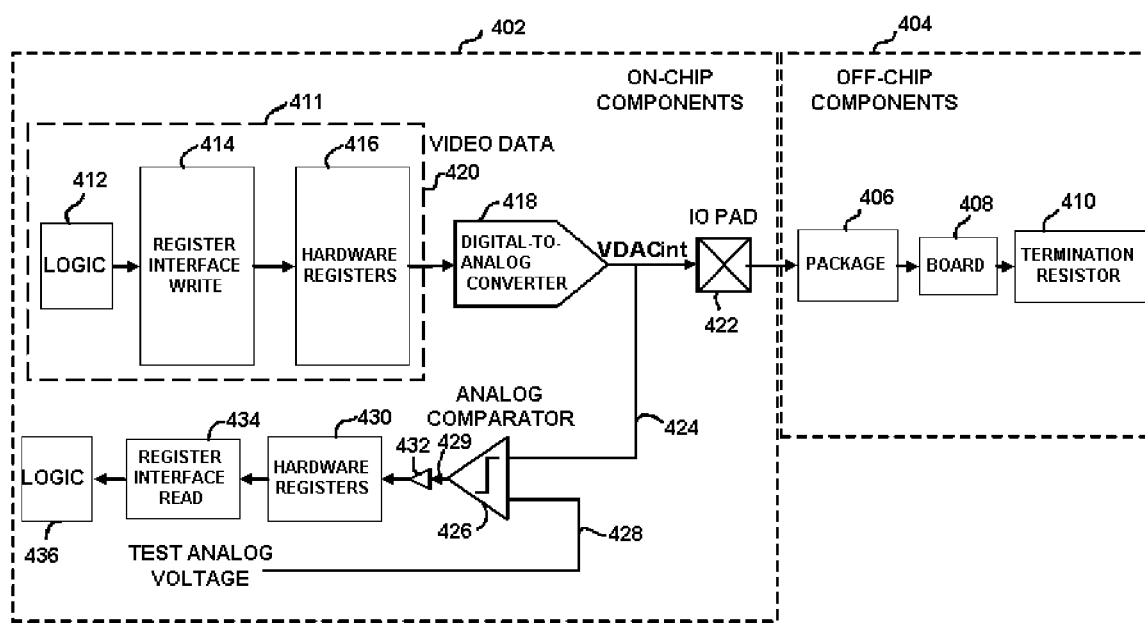
FIG. 4 illustrates example of an apparatus for on-chip measurement of analog voltages according to the present disclosure.

FIG. 4, in particular, illustrates an example of an apparatus for on-chip measurement of analog voltages within an integrated circuit. The apparatus is contained within an integrated circuit, chip or die 402. FIG. 4 also illustrates off-chip components 404, which include a package 406, which may consist of bond wires or RDL routing traces in the case of flip-chip technology, and a circuit board 408 on which the integrated circuit package 406 is mounted. Additionally, in the case of a video DAC channel, an optional termination resistor 410 is illustrated. This resistor 410 is a typical termination device utilized in video DAC channels, such as video DACs used to drive display media, such as a monitor, for example.

Within the integrated circuit 402, the apparatus for measuring analog voltages includes a variable programmable circuit 411 having a programmable logic 412, which typically is contained within the integrated circuit 402 and is configured to output a plurality of digital codes. In particular, logic 412 is programmed to vary or sweep through an incremental range of digital codes in order to effect a range of analog voltages output from a DAC, as will be explained below. The variable programmable circuit 411 also includes a write register interface 414 that receives data from the logic 412 and, in turn, passes the digital values to a set of hardware registers 416. The plurality of digital codes are then incrementally read out of the hardware registers 416 to a digital-to-analog converter 418. It is noted that the digital-to-analog converter 418 may be a separate, dedicated DAC or, as explained previously, or may be a DAC normally used as a video DAC and serving the dual functions of driving a display media or, alternately, testing analog voltages within the integrated circuit 402. An example of this dual usage is, in part, illustrated by dashed box 420 representing video data delivered to digital-to-analog 418 when the DAC 418 is not being used to test analog voltages.

After the plurality of digital codes are delivered to the DAC 418, the DAC converts the digital codes to corresponding analog voltages, labeled VDAC int as illustrated in FIG. 4. Because the DAC 418 may be an extant device within the integrated circuit 402 for, as an example, driving a display media, the output of the DAC 418 is also shown outputting to an I/O pad 422 for output of signals off of the integrated circuit or die 402.

The output analog voltage (VDAC int) is input via line 424 to a comparator circuit 426. The comparator circuit 426 is configured to compare the analog voltage output (e.g., VDAC int) from DAC 418 with the test analog voltage, which is delivered via input 428 to the comparator circuit 426. The comparator circuit 426 includes an analog comparator that is operable to switch its output state based on the comparison of the two input voltages. For example, the analog comparator 426 maintains a logic value of zero as long as the voltage on line 424 (i.e., VDAC int) is less than the test analog voltage input via line 428. When the voltage value of the VDAC int exceeds the test analog voltage at input 428, the polarity of the analog comparator output 429 changes. That is, for example, the output changes from a logic output of zero to a logic output of one, which may be equal to the voltage supply value of the analog comparator 426. It is noted, however, that one of ordinary skill in the art may contemplate any number of suitable circuits equivalent to comparator circuit 426 that are operable to detect and indicate when the value of the VDAC int is at or exceeds a desired level (e.g, the test analog voltage). Also, one of ordinary skill would contemplate that rather than incrementing through a range of digital codes, the codes could alternatively be decremented and detection includes determining when the value of the VDAC int falls below the test analog voltage.

Once a change in state of the comparator circuit 426 occurs when the output of the DAC 418 has higher voltage than the test analog voltage, the comparator output bit is stored in a hardware register 430. It is noted here that this output 429 could also include a buffer 432 interposed between the comparator circuit 428 and the register 430. The use of buffer 432 allows for full digital signal level regeneration for comparators that do not swing rail-to-rail at its output, such as an operational amplifier, which may be used to implement comparator 426.

A read register interface 434 then reads the result (which could be a change in the value of a bit in the register 430) that is stored in the hardware register 430 and provides the result to a logic 436, which may be the same as logic 412 or a separate logic. Regardless, the last input digital value from the programmable circuit 411 is then noted using logic 412, 436 or both and used to derive a digital data or code representation of the test analog voltage that is being tested. Comparator offset voltage and device mismatch aside, it is noted that the resolution of this measurement is limited by the least significant bit voltage level of the digital-to-analog converter 418. For example, if the DAC 418 is a ten-bit DAC with full-scale of 1V, the measurement resolution for the analog voltage would be approximately plus or minus 0.5 mV.

Using the above-described apparatus with VIS integrated circuits, for example, which include digital-to-analog converters, such as in video graphics ASIC, the cost of measuring on-chip analog voltages, at least voltage within the range of the already included DACs, is essentially free. The only additional devices needed in the present apparatus are registers and an analog comparator which are relatively easily implemented with negligible additional cost and utilize little space on the die 402.

It is further noted that the apparatus of FIG. 4 is, in particular, describes a method of manual evaluation of on-chip analog test voltages. Nonetheless, the testing apparatus may also be automated such that manual operation is not needed. An exemplary apparatus for achieving automated measurement is illustrated by way of example and not limited in FIG. 5.

Figure 5:
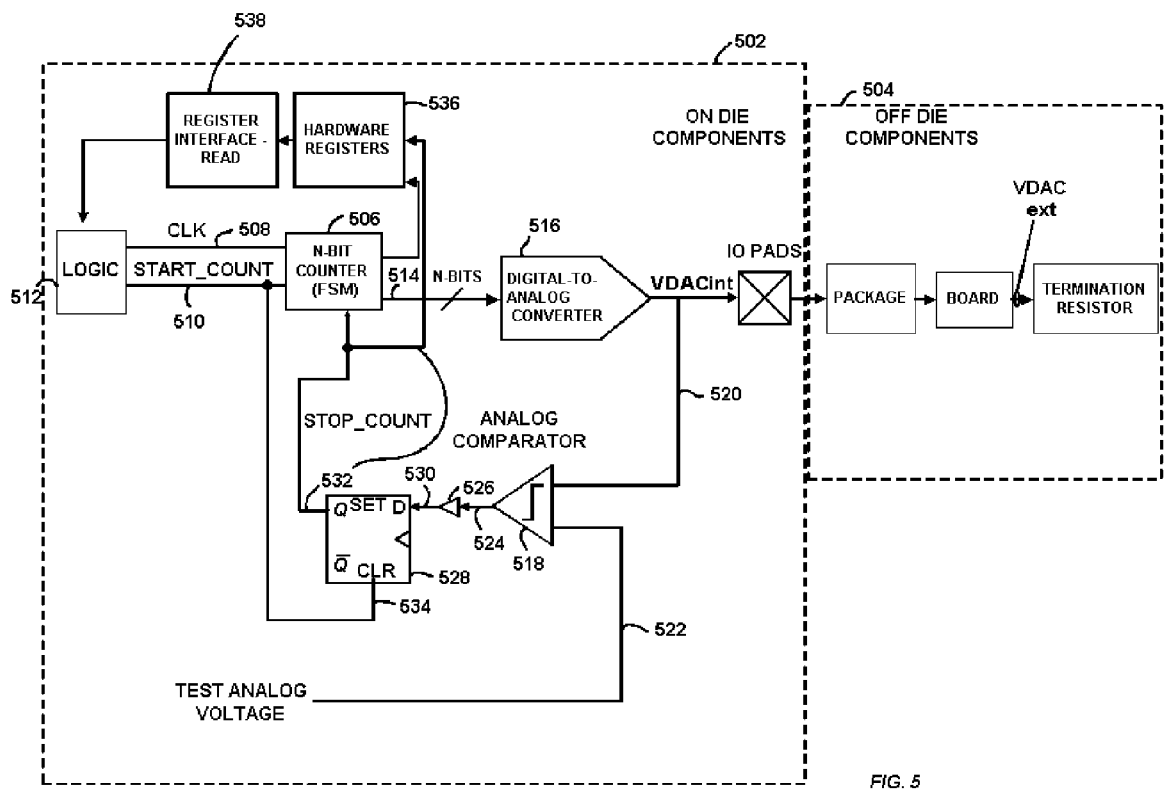
FIG. 5 illustrates another example of an arrangement for on-chip measurement of analog voltages in an integrated circuit.

As illustrated in FIG. 5, an integrated circuit 502 includes an apparatus to test analog voltages on-chip. It is first noted that completeness of illustrating the example, the off-die components 504 are also illustrated and are the same as the off-die components 404, described previously with respect to FIG. 4.

As shown in FIG. 5, the integrated circuit 502 includes a programmable counter 506, which may be a finite state machine (FSM), as an example. The counter 506 receives a clock signal 508 and a start count signal (START_COUNT) 510 from a logic 512 which may also be located within the integrated circuit 502. In particular, the START_COUNT signal 510 resets all the bits of the counter to zero. For example, if the counter 506 was an 8-bit counter, the output 514 would be reset to a value of "0X00." Based on the clock input 508, the counter 506 would then begin to count out with increments of 1. In an example using a 10-bit DAC 516, the count would then conceivably continue up to a maximal value of "0×3FF." The counter 506 supplies an output 514 to a digital-to-analog converter (DAC) 516.

An output of the DAC 516, which is labeled VDAC int is then supplied to a comparator circuit 518 via line 520. Another line 522 supplies a test analog voltage to the comparator circuit 518. When the analog voltage VDAC int exceeds the test analog voltage 522, the output of the comparator circuit 518, which may be an analog comparator, changes polarity at its output 524. The output 524 is then fed to a sequential logic 528 via an optional buffer 526. The sequential logic 528 may include a flip-flop, such as the RS flip-flop illustrated in FIG. 5, a latch, or any other suitable logic that triggers a change in the logic state of its output based on a change in logic state of its input. In the illustrated example, an input 530 of the sequential logic, which is a flip-flop, is operable to change the logic state of its output 532 corresponding to the change of the output 524 of the comparator circuit 518. In the illustrated example, the sequential logic 528 is also connected to receive the start count signal via line 534 each time the N-bit counter 506 is reset. The output 532 of the sequential logic is also labeled as a STOP_COUNT signal or bit as illustrated because this signal is operable to stop the N-bit counter 506 from further code increments once the output of the analog comparator 524 changes state.

For the purpose of measuring the value output by the N-bit counter 506, a hardware register 536 is connected to the counter 506 via connection 535. The hardware register 536 is configured to store a current value of the N-bit counter 506 received via line 535 until the STOP_COUNT signal is received via line 532. When the STOP_COUNT signal or bit is received by the hardware register 536, the register contains the N-bit code from the counter 506, which then may be read through a read register interface 538 back to, for example, the logic 512. The logic 512, in turn, may then determine the test analog voltage by correlating the final N-bit code of counter 506, which is representative of the test analog voltage in a digital form. It is noted that STOP_COUNT bit or signal is delivered to the hardware register 536 in order to ensure that the hardware register 536 holds the final N-bit code. This bit or signal, however, is optional as the counter 506 is stopped by the STOP_COUNT signal or bit and no further values afterwards are written to register 536. Nonetheless, the delivery of this signal or bit to a hardware register 536 may be used to signal or trigger the read register interface 538 or the logic 512 to know when to read the final N-bit value, as well as to signal the logic 512 to issue the START_COUNT signal or bit 510 to reset the counter 506 and the sequential logic 528.

Figure 6:
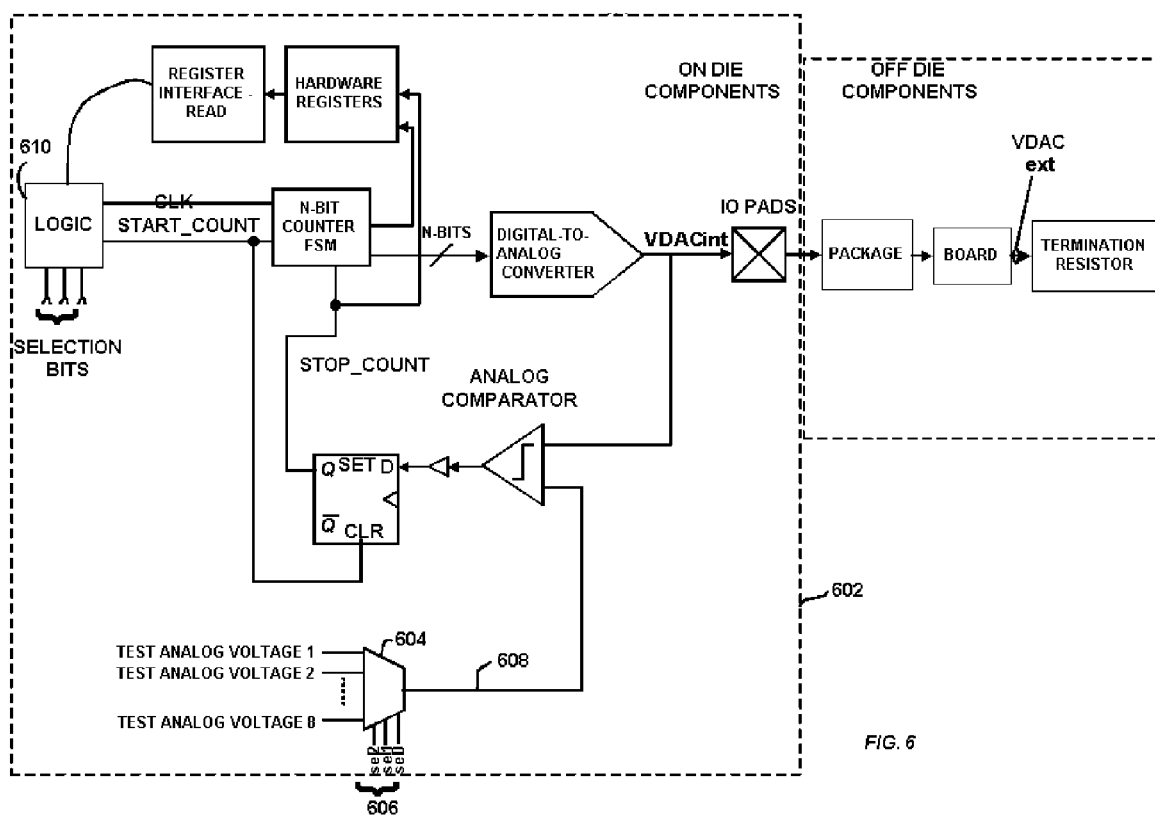
FIG. 6 illustrates another example of an arrangement for on-chip measurement of analog voltages in an integrated circuit.

FIG. 6 illustrates another example of an automated testing apparatus within an integrated circuit 602 that affords testing of multiple analog voltages. This functionality may be effected by utilizing multiplexer 604, which is configured to receive two or more test analog voltages. In the illustrated example of FIG. 6, an 8-input multiplexer 604 is illustrated for receiving eight test analog voltages (1-8). In order to select which of the test analog voltages at the inputs of multiplexer 604 are output to an output 608 of the multiplexer 604, a number of selection bits 606 are input to the multiplexer 604. As illustrated in the example of FIG. 6, three selection bits SEL0, SEL1, and SEL2 are input since three bits would be required to select between eight inputs to the multiplexor 604. This number, however, is merely exemplary and one of ordinary skill in the art will appreciate that any number of input test analog voltages could be delivered to a multiplexer to select between any desired number of voltages to be tested. Moreover, it is noted that the selection bits 606 may be issued by a logic 610, for example which is analogous to the logic 512 in the example of FIG. 5. The remainder of the apparatus of FIG. 6 is identical to the example of FIG. 5 in structure and operation, as was described previously.

Figure 7:
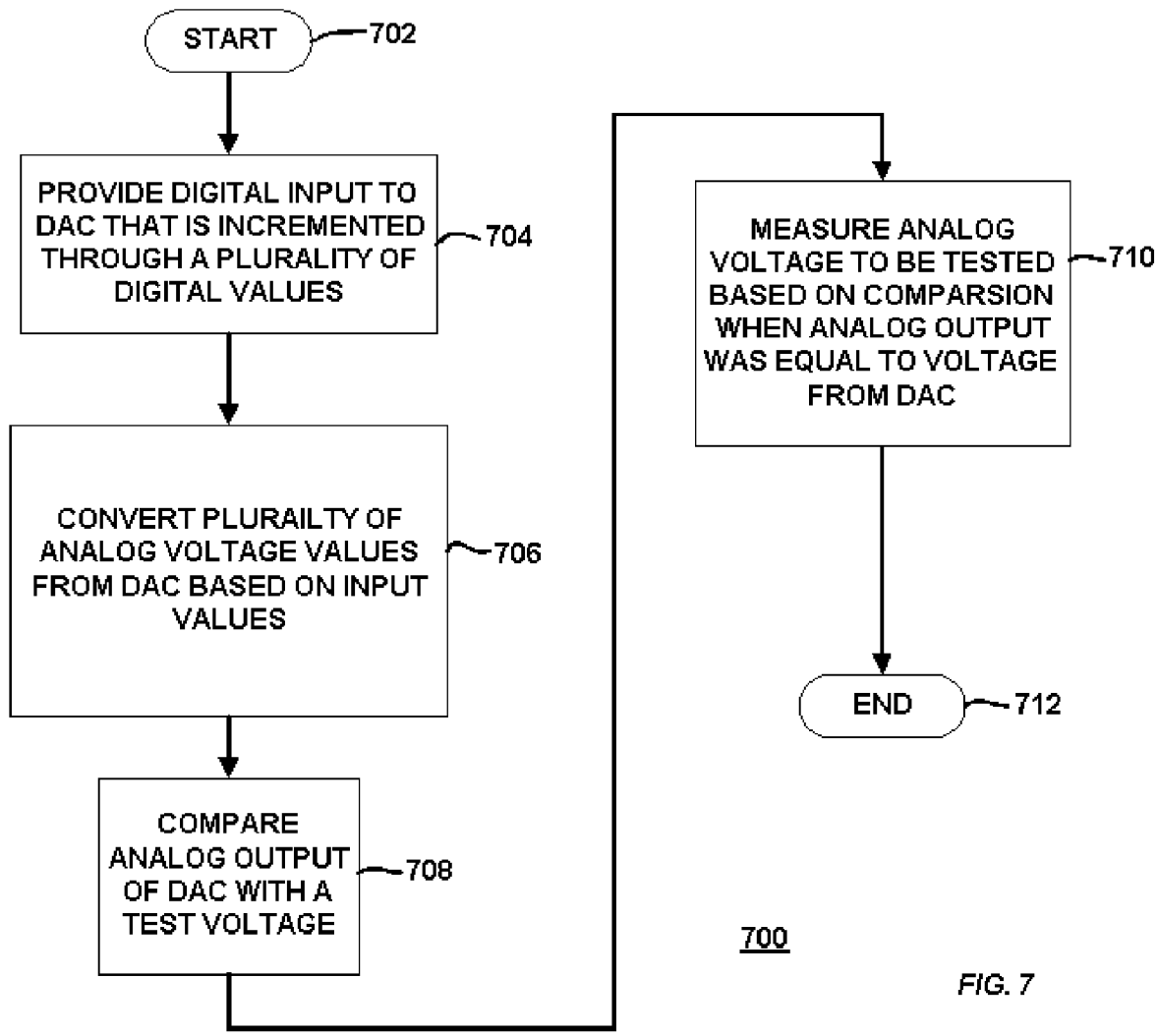
FIG. 7 illustrates a flow diagram of an example of a methodology for measuring analog voltages in an integrated circuit.

FIG. 7 illustrates a flow diagram of operations that are effected in order to provide analog voltage measurement according to an example. As illustrated, the process 700 is initiated at a start block 702 and proceeds to block 704. At block 704, a digital input is provided to a digital-to-analog converter where the digital input is incremented through a plurality of digital codes. For example, this process is carried out by the programmable circuit 411 of the example of FIG. 4 or the logic 512 or 610 on the examples of FIGS. 5 and 6, respectively.

Next, flow proceeds to block 706 where the digital input code to the DAC, such as DAC 418 of FIG. 4, is converted to a corresponding analog voltage level. Next, the analog output of the DAC is compared with the analog test voltage as shown in block 708. This process may be effected, for example, by the comparator circuit 426 of FIG. 4. In block 710, the result of the comparison in block 708 would determine whether the next step would be to go back to block 706 after incrementing the DAC input code, or proceeding to block 712 while holding the current digital code.

When the condition in block proceeds to block 712, the test analog voltage is measured based on the comparison when the DAC output voltage exceeds the test analog voltage. In other words, as explained previously, the analog voltage is measured by correlating a current digital input code to the DAC when the comparator circuit changes polarity and correlates this to the voltage value of the test analog voltage. Flow then proceeds to block 714 where the process 700 terminates.

The foregoing description of the present methods and apparatus afford measurement of analog voltages within or on an integrated circuit or die. It is noted that the analog voltages measured may include core voltages and also core grounds. The use of existing digital-to-analog converters within the integrated circuit, in particular, provide an economical solution to testing voltages, which also ameliorates the detrimental effects bringing a voltage off-die through the integrated circuit package and the printed circuit board, thus affording more accurate measurement of the test analog voltages. Furthermore, because off-die components do not require any special set up such as the connection of a multimeter or oscilloscope known in the prior art, the ease of measurement is increased and also the need for any buffering or additional input/output pads to drive a test analog voltage off the chip is eliminated.

The above-detailed description of the examples has been presented for the purposes of illustration and description only and not by limitation. It is therefore contemplated that the present application cover any additional modifications, variations or equivalents that fall within the spirit and scope of the basic underlying principles disclosed above and in the appended claims.

What is claimed is:

1. An apparatus for measurement of analog voltages within an integrated circuit comprising:
    an on-chip digital-to-analog converter configured to receive a variable digital input code and to output a corresponding analog voltage;
    an on-chip comparator circuit configured to receive the analog voltage output by the digital-to-analog converter and a test analog voltage as inputs and to provide an output indicating a result of a voltage comparison between the analog voltage output by the digital-to-analog converter and the test analog voltage; and
    on-chip logic operative to determine the test analog voltage based on the output of the comparator circuit,
    wherein the digital-to-analog converter is a video digital-to-analog converter located in the integrated circuit and the video digital-to analog converter is also utilizable for displaying video data.

2. An apparatus as defined in claim 1, wherein the on-chip logic is configured to determine the test analog voltage based on the output of the comparator circuit by correlating a current value of the variable digital input code to the test analog voltage in response to and concurrent with the output of the comparator circuit changing state.

3. An apparatus as defined in claim 1, further comprising a variable programmable circuit configured to output the variable digital input code.

4. An apparatus as defined in claim 3, wherein the variable programmable circuit includes programmable logic configured to generate the variable digital input code, a register interface configured to receive the variable digital input code from the programmable logic; and one or more registers configured to receive and store the variable digital input code from the programmable logic via the register interface.

5. An integrated circuit as defined in claim 4, wherein the programmable logic is configured to generate the variable digital input code by outputting an incremented or decremented range of digital codes.

6. An apparatus as defined in claim 3, wherein the variable programmable circuit comprises a programmable counter configured to output the variable digital code by incrementally or decrementally counting through a range of digital codes.

7. An apparatus as defined in claim 6, further comprising logic configured to change state as the output of the comparator circuit changes state and to direct the programmable counter to stop counting and to trigger a hardware register to read a current count value representative of a current variable digital input code of the programmable counter after it is stopped.

8. An apparatus as defined in claim 1, further comprising one or more registers and at least one interface logically configured to correlate the value of the variable digital input code to the test analog voltage when the comparator circuit output changes state.

9. An apparatus as defined in claim 1, wherein the comparator circuit is an analog comparator having an output that switches states when the analog voltage output by the digital-to-analog converter is:
    at the test analog voltage;
    greater than the test analog voltage; or
    less than the test analog voltage.

10. An apparatus as defined in claim 1, further comprising a multiplexer operable to receive two or more test analog voltages and to enable selection of a particular one of the two or more test analog voltages to be delivered to the comparator circuit.

11. A method for measurement of analog voltages in an integrated circuit comprising:
    converting, on-chip, a variable digital input code to a corresponding analog voltage;
    comparing, on-chip, the analog voltage corresponding to a variable digital input code to a test analog voltage provided on chip; and
    determining the test analog voltage based on the comparison of the analog voltage corresponding to the variable digital input code and the test analog voltage,
    wherein converting the variable digital input code to a corresponding analog voltage is performed by a digital-to-analog converter, and wherein the digital-to-analog converter is a video digital-to-analog converter also utilizable for displaying video data.

12. A method as defined in claim 11, wherein the method further comprises incrementing or decrementing the variable digital input code through a range of digital codes.

13. A method as defined in claim 11, wherein the determining the test analog voltage based on the comparison of the analog voltage corresponding to the variable digital input code and the test analog voltage comprises correlating a current value of the variable digital input code to the test analog voltage when the analog voltage corresponding to the variable digital input code is:
    at the test analog voltage;
    greater than the test analog voltage; or
    less than the test analog voltage.

14. An apparatus for measurement of analog voltages within an integrated circuit comprising:
    an on-chip programmable circuit configured to output a plurality of digital input codes by outputting a first digital input code and subsequently outputting one or more additional digital input codes incrementally or decrementally through a range of digital input codes;
    an on-chip digital-to-analog converter configured to convert a current digital input code into a corresponding analog voltage;
    an on-chip comparator circuit configured to compare a current analog voltage output from the digital-to-analog converter to a test analog voltage; and
    on-chip logic operative to determine the test analog voltage based on the comparison,
    wherein the digital-to-analog converter is a video digital-to-analog converter also utilizable for displaying video data.

15. An integrated circuit as defined in claim 14, wherein the programmable circuit includes programmable logic configured to generate the plurality of digital input codes, a register interface configured to receive the plurality of digital input codes from the programmable logic; and one or more registers configured to receive and store the plurality of digital input codes from the programmable logic via the register interface.

16. An integrated circuit as defined in claim 14, wherein the programmable circuit comprises:
    a programmable counter configured to output the plurality of digital input codes by incrementally or decrementally counting through the range of digital input codes.

17. An integrated circuit as defined in claim 14, further comprising a multiplexer operable to receive two or more test analog voltages and to enable selection of a particular one of the two or more test analog voltages to be delivered to the comparator circuit.

18. An integrated circuit as defined by claim 14, wherein the on-chip logic is operative to determine the test analog voltage based on the comparison by correlating a current value of the digital input code to the test analog voltage when the comparator circuit determines that the current analog voltage output from the digital-to-analog converter is:

at the test analog voltage;

greater than the test analog voltage; or less than the test analog voltage.

19. An integrated circuit as defined in claim 18, wherein the comparator circuit is an analog comparator that switches states when the current analog voltage output from the digital-to-analog converter is:

at the test analog voltage;

greater than the test analog voltage; or less than the test analog voltage.

20. An integrated circuit as defined in claim 19 wherein:

the programmable circuit comprises a programmable counter configured to output the plurality of digital input codes by incrementally or decrementally counting through the range of digital input codes; and the integrated circuit further comprises:

one or more hardware registers; and logic configured to change state as the output of the comparator circuit changes state and to direct the programmable counter to stop counting and to trigger the one or more hardware registers to read the current count value of the counter after it is stopped.

21. An integrated circuit as defined in claim 19, wherein the integrated circuit further comprises one or more registers and at least one interface logically configured to correlate the value of the digital input code to the test analog voltage when the comparator circuit output changes state.

\* \* \* \* \*